(12) United States Patent
Cen et al.

(10) Patent No.: US 12,159,804 B2
(45) Date of Patent: Dec. 3, 2024

(54) TUNGSTEN MOLYBDENUM STRUCTURES

(71) Applicant: Applied Materials, Inc., Santa Clara, CA (US)

(72) Inventors: Xi Cen, San Jose, CA (US); Kai Wu, Palo Alto, CA (US); Dixiong Wang, Milpitas, CA (US); Yi Luo, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 227 days.

(21) Appl. No.: 17/654,077

(22) Filed: Mar. 9, 2022

(65) Prior Publication Data

US 2023/0290679 A1   Sep. 14, 2023

(51) Int. Cl.
| | |
|---|---|
| *H01L 21/768* | (2006.01) |
| *C23C 16/14* | (2006.01) |
| *H01L 23/532* | (2006.01) |
| *H01L 21/285* | (2006.01) |

(52) U.S. Cl.
CPC ........ *H01L 21/76876* (2013.01); *C23C 16/14* (2013.01); *H01L 21/76846* (2013.01); *H01L 23/53261* (2013.01); *H01L 23/53266* (2013.01); *H01L 21/28568* (2013.01)

(58) Field of Classification Search
CPC ......... H01L 21/28562; H01L 21/76843; H01L 21/76877; H01L 21/28556; H01L 21/76846; H01L 21/28568; C23C 16/045; C23C 16/14

See application file for complete search history.

(56) References Cited

U.S. PATENT DOCUMENTS

| | | |
|---|---|---|
| 6,939,804 B2 | 9/2005 | Lai et al. |
| 7,863,190 B1 | 1/2011 | Papasouliotis et al. |
| 8,119,527 B1 | 2/2012 | Chadrashekar et al. |
| 8,124,531 B2 | 2/2012 | Chandrashekar et al. |
| 8,435,894 B2 | 5/2013 | Chandrashekar et al. |
| 8,835,317 B2 | 9/2014 | Chandrashekar et al. |
| 9,034,768 B2 | 5/2015 | Chandrashekar et al. |
| 9,169,556 B2 | 10/2015 | Wu et al. |
| 9,240,347 B2 | 1/2016 | Chandrashekar et al. |
| 9,330,939 B2 | 5/2016 | Zope et al. |
| 9,349,637 B2 | 5/2016 | Na et al. |
| 9,425,078 B2 | 8/2016 | Tang et al. |

(Continued)

FOREIGN PATENT DOCUMENTS

| | | |
|---|---|---|
| WO | 2020106649 A1 | 5/2020 |
| WO | 2020112487 A1 | 6/2020 |

(Continued)

OTHER PUBLICATIONS

Written Opinion of the International Searching Authority for Application No. PCT/US2022/052959 dated May 2, 2023.

*Primary Examiner* — Tony Tran
(74) *Attorney, Agent, or Firm* — Patterson + Sheridan, LLP

(57) ABSTRACT

A structure is provided including a substrate and a tungsten-containing layer. The tungsten-containing layer includes a nucleation layer disposed on the substrate and a bulk layer is disposed over the nucleation layer. The nucleation layer includes tungsten and the bulk layer includes about 0.1% to about 20% atomic molybdenum. The tungsten-containing layer includes a film stress of about 350 MPa to about 450 MPa.

8 Claims, 8 Drawing Sheets

(56) References Cited

U.S. PATENT DOCUMENTS

| | | |
|---|---|---|
| 9,548,228 B2 | 1/2017 | Chandrashekar et al. |
| 9,564,312 B2 | 2/2017 | Henri et al. |
| 9,653,352 B2 | 5/2017 | Wu et al. |
| 9,653,353 B2 | 5/2017 | Chandrashekar et al. |
| 9,685,371 B2 | 6/2017 | Zope et al. |
| 9,837,312 B1 | 12/2017 | Tan et al. |
| 9,997,405 B2 | 6/2018 | Chandrashekar et al. |
| 10,103,058 B2 | 10/2018 | Chandrashekar et al. |
| 10,157,787 B2 | 12/2018 | Park et al. |
| 10,170,320 B2 | 1/2019 | Wang et al. |
| 10,211,099 B2 | 2/2019 | Wang et al. |
| 10,242,879 B2 | 3/2019 | Na et al. |
| 10,256,114 B2 | 4/2019 | Huemoeller et al. |
| 10,256,142 B2 | 4/2019 | Chandrashekar et al. |
| 10,381,266 B2 | 8/2019 | Yang et al. |
| 10,438,847 B2 | 10/2019 | Lai et al. |
| 10,559,461 B2 | 2/2020 | Reddy et al. |
| 10,566,211 B2 * | 2/2020 | Chandrashekar ............ H01L 21/32136 |
| 10,573,522 B2 | 2/2020 | Jandl et al. |
| 10,580,695 B2 | 3/2020 | Chandrashekar et al. |
| 10,600,685 B2 | 3/2020 | Yao et al. |
| 10,643,889 B2 | 5/2020 | Hausmann et al. |
| 10,662,526 B2 | 5/2020 | Hausmann et al. |
| 10,727,046 B2 | 7/2020 | Abel et al. |
| 2011/0244682 A1 | 10/2011 | Khandelwal et al. |
| 2014/0061931 A1 | 3/2014 | Kang |
| 2016/0056039 A1* | 2/2016 | Kim ............ H01L 21/02614 136/252 |
| 2016/0190008 A1 | 6/2016 | Chandrashekar et al. |
| 2019/0019725 A1 | 1/2019 | Chandrashekar et al. |
| 2019/0206731 A1 | 7/2019 | Chandrashekar et al. |
| 2019/0326168 A1 | 10/2019 | Yang et al. |
| 2019/0371662 A1 | 12/2019 | Chen et al. |
| 2020/0017967 A1 | 1/2020 | Abel et al. |
| 2020/0144066 A1 | 5/2020 | Jandl et al. |
| 2020/0185273 A1 | 6/2020 | Chandrashekar et al. |
| 2020/0242209 A1 | 7/2020 | Bowes et al. |
| 2021/0238736 A1* | 8/2021 | Butail ............ C23C 16/045 |

FOREIGN PATENT DOCUMENTS

| | | |
|---|---|---|
| WO | 2020112616 A1 | 6/2020 |
| WO | 2020118100 A1 | 6/2020 |
| WO | 2020168071 A1 | 8/2020 |

* cited by examiner

TUNGSTEN MOLYBDENUM STRUCTURES

BACKGROUND

Field

Embodiments herein are directed to methods used in electronic device manufacturing, and more particularly, to methods used for forming conductive structures containing tungsten and molybdenum in a semiconductor device.

Description of the Related Art

Tungsten (W) is widely used in integrated circuit (IC) device manufacturing to form conductive features where relatively low electrical resistance and relativity high resistance to electromigration are desired. For example, tungsten may be used as a metal fill material to form source contacts, drain contacts, metal gate fill, gate contacts, interconnects (e.g., horizontal features formed in a surface of a dielectric material layer), and vias (e.g., vertical features formed through a dielectric material layer to connect other interconnect features disposed there above and there below). Due to its relativity low resistivity and high melting point, tungsten is also commonly used to form bit lines and word lines used to address individual memory cells in a memory cell array of a dynamic random-access memory (DRAM) device.

As circuit densities increase and device features continue to shrink to meet the demands of the next generation of semiconductor devices, reliably producing tungsten features has become increasingly challenging. The advances in integrated circuit technology have necessitated improved methods depositing of refractory metals, particularly tungsten, to enhance the gap filling properties and reduce the stress of the same. Traditionally, the gap filling property and the stress are two characteristics of refractory metal layers that have been in conflict due to the competing desires to have a high deposition process throughput but also have a low level of stress and good gap fill characteristics.

Accordingly, there is a need for processes to form structures having low resistivity and reduced stress properties.

SUMMARY

In some embodiments, an interconnect structure is provided including a substrate and a tungsten-containing layer. The tungsten-containing layer includes a nucleation layer disposed on the substrate and a bulk layer is disposed over the nucleation layer. The nucleation layer includes tungsten and the bulk layer includes about 0.1% to about 20% atomic molybdenum disposed over the nucleation layer. The tungsten-containing layer includes a film stress of about 350 MPa to about 450 MPa.

In some embodiments, a method is provided including forming an interconnect structure over a substrate. The method includes forming a nucleation layer over the substrate. Forming the nucleation layer includes exposing the substrate to a tungsten-containing precursor gas at a precursor gas flow rate and exposing the substrate to a reducing agent at a reducing agent flow rate. The tungsten-containing precursor gas and the reducing agent are alternated cyclically. The method includes forming a bulk layer over the nucleation layer. Forming the bulk layer over the nucleation layer includes co-flowing the tungsten-containing precursor and a molybdenum-containing precursor. The bulk layer includes molybdenum and tungsten.

In some embodiments, a method of forming an interconnect structure over a substrate is provided. The method includes forming a nucleation layer over the substrate using atomic layer deposition and forming a bulk layer over the nucleation layer. Forming the bulk layer includes co-flowing a tungsten precursor and a molybdenum precursor. A ratio of tungsten precursor flow to molybdenum precursor flow is n:1 by volume, where n is about 1 to about 300.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments herein are generally directed to electronic device manufacturing and, more particularly, to systems and methods for forming a structure having a material layer that includes tungsten (W) and molybdenum (Mo) in a semiconductor device manufacturing scheme. Without being bound by theory, forming a tungsten-molybdenum alloy reduces the overall stress of the structure, without substantially affecting throughput, resistivity, or surface roughness relative to conventional tungsten structures that do not include molybdenum.

Figure 1:
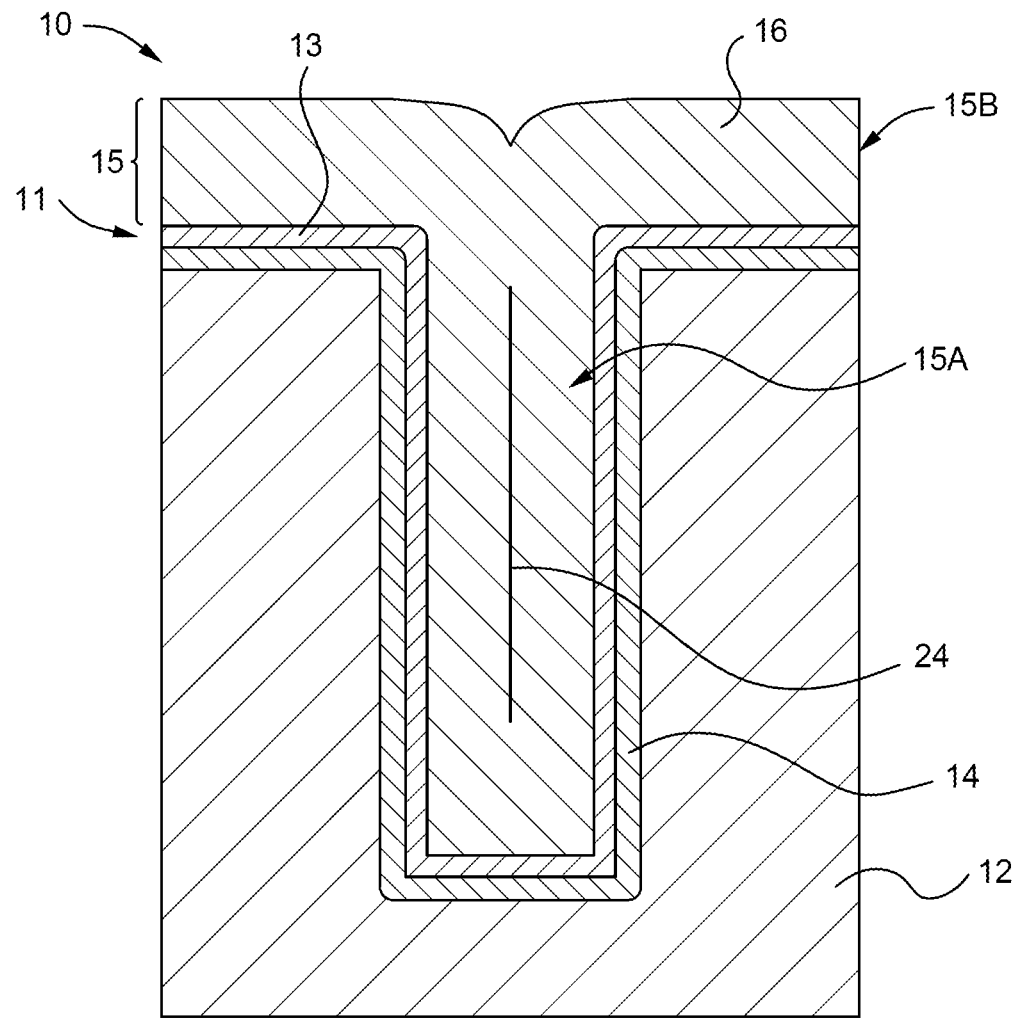
FIG. 1 is a schematic cross-sectional view of a portion of a substrate having a tungsten-containing layer, according to one embodiment.

FIG. 1 is a schematic cross-sectional view of a substrate 10 illustrating a tungsten-molybdenum structure. Here, the substrate 10 includes a patterned surface 11 including a dielectric layer 12 having a high aspect ratio opening formed therein (shown filled with a portion of tungsten-containing layer 15), a barrier material layer 14 deposited on the dielectric layer 12 to line the opening, and the tungsten-containing layer 15 deposited on the barrier material layer 14. The tungsten-containing layer 15 includes an alloy of tungsten and molybdenum.

The tungsten-containing layer 15 is formed using a chemical vapor deposition (CVD), a plasma enhanced CVD, or atomic layer deposition (ALD) process where the tungsten-containing layer 15 is conformally deposited (grown) on the patterned surface 11 to fill the opening, to cover a planar surface, or a combination thereof. The structure includes a substantially uniform profile as the opening extends from the surface of the substrate 10 into the dielectric layer 12. The openings in the substrate can include one or a combination of high aspect ratio via or trench openings having a width of about 1 µm or less, such as about 800 nm or less, or about 500 nm or less, and a depth of about 2 µm or more, such as about 3 µm or more, such as about 4 µm or more, such as about 8 µm or more. In some embodiments, each of the openings may have an aspect ratio (depth to width ratio) of about 3:1 or more, such as about 5:1 or more, such as about 10:1 or more, such as about 50:1 or more. In some embodiments, the vias or trench openings are about 20 nm to about 50 nm having aspect ratios of about 3:1 to about 10:1.

The barrier material layer 14 can include a material suitable for utilization as barrier layer, such as, but not limited to, titanium and tantalum, alloys, combinations, mixtures, and nitrides thereof. In one example, the barrier material layer 14 can be a titanium nitride (TiN) layer, deposited on the dielectric material layer 12 to conformally line the openings and facilitate the subsequent deposition of a nucleation layer 13. In some embodiments, the barrier material layer 14 is deposited to a thickness of about 50 angstroms (Å) to about 150 Å, such as about 70 Å to about 100 Å.

In some embodiments, the tungsten-containing layer 15 includes the nucleation layer 13 and a bulk layer 16, which can be deposited using one or more of the methods described below. The nucleation layer 13 includes tungsten and the bulk layer 16 includes about 0.1% to about 20% atomic molybdenum disposed over the nucleation layer 13, such as about 1% to about 5% atomic molybdenum, or about 10% to about 15% molybdenum.

In some embodiments, the tungsten-containing layer 15 includes a stress reduction of about 10% to about 50% relative to a tungsten-containing layer that is free of molybdenum, such as about 15% to about 40% reduction, such as about 20% to about 30% reduction. In some embodiments, the tungsten-containing layer 15 includes a stress reduction of about 10 MPa to about 400 MPa relative to a tungsten-containing layer that is free of molybdenum, such as about 50 MPa to about 200 MPa, such as about 100 MPa to about 150 MPa. The tungsten-containing layer 15 includes a film stress of about 350 MPa to about 450 MPa. The tungsten-containing layer 15 includes a resistivity that is within about 10% greater than the resistivity of a tungsten-containing layer that is free of molybdenum.

In some embodiments, the thickness of the tungsten-containing layer 15 is about 400 Å to about 1800 Å, such as about 600 Å to about 800 Å, and the resistivity of the tungsten-containing layer is about 15 µΩ·cm or less. In some embodiments, the thickness of the tungsten-containing layer 15 is about 700 Å and has a resistivity of about 14 µΩ·cm. In some embodiments, the thickness of the tungsten-containing layer 15 is about 1800 Å and has a resistivity of about 11 µΩ·cm.

Accordingly, embodiments herein provide a processing system that is configured to perform a combination of the individual aspects of the methods without transferring a substrate between processing chambers, thus improving overall substrate processing throughput and capacity for the tungsten gapfill processing schemes described herein. In some embodiments, certain method disclosed herein are selected based on the topology of the substrate surface. Specifically, certain methods may be used for substrates having high aspect ratio feature, such as about 10:1 or higher, and other method are suitable for substrates having a substantially planar surface, or having features having low aspect ratios. By way of example, the tungsten-containing layer 15 includes a tungsten-containing gapfill 15A within openings formed on the substrate. Additionally, or alternatively, the tungsten-containing layer 15 includes a planar tungsten-containing layer 15B disposed over planar surfaces (e.g., field region) of the substrate. It has been discovered that certain processes are more suitable for planar tungsten-containing layer 15B deposition, such as uniform deposition across a planar region of a substrate (e.g., field region) using a chemical vapor deposition (CVD) process. It has also been discovered that certain processes are more suitable for tungsten-containing gapfill 15A deposition, such as a chemical vapor deposition processes that include a purge step between each exposure of deposition gases. To reduce the formation of seam in a feature (e.g., via or trench) formed on a substrate, a nitrogen radical treatment or thermal soak using ammonia can be used after nucleation to suppress growth on the field and at a top portion of the feature formed in the substrate. By use of the methods described herein, the tungsten-containing gapfill 15A is deposited into openings and is substantially free of seams 24 within the opening, such as by filling the opening from a bottom of the opening upwards.

Figure 2:
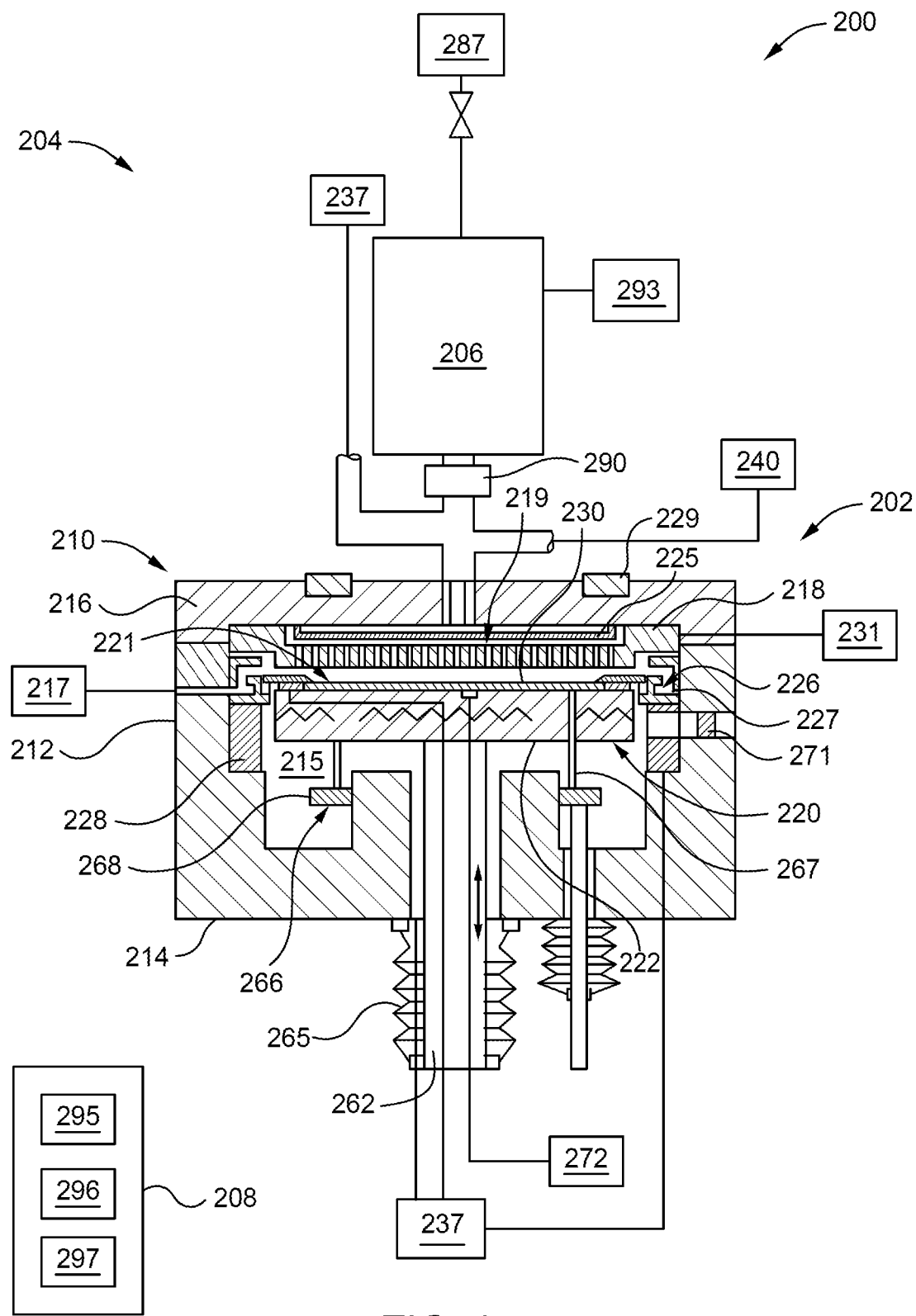
FIG. 2 is a schematic side view of a processing system that may be used to implement the methods set forth herein, according to one embodiment.

FIG. 2 schematically illustrate a processing system 200 that may be used to perform the processing methods described herein. Here, the processing system is configured to provide the processing conditions for each of a nucleation process, selective gapfill process, and surface deposition process within a single processing chamber 202, i.e., without transferring a substrate between a plurality of processing chambers. However, in some embodiments, the substrate is transferred from the processing chamber 202 to other processing chambers that can be used to deposit additional layers over the substrate.

As shown in FIG. 2, the processing system 200 includes a processing chamber 202, a gas delivery system 204 fluidly coupled to the processing chamber 202, and a system controller 208. The processing chamber 202 includes a chamber lid assembly 210, one or more sidewalls 212, and a chamber base 214, which collectively define a processing volume 215. The processing volume 215 is fluidly coupled to an exhaust 217, such as one or more vacuum pumps, used to maintain the processing volume 215 at sub-atmospheric conditions and to evacuate processing gases and processing by-products therefrom.

The chamber lid assembly 210 includes a lid plate 216 and a showerhead 218 coupled to the lid plate 216 to define a gas distribution volume 219 therewith. Here, the lid plate 216 is maintained at a desired temperature using one or more heaters 229 thermally coupled thereto. The showerhead 218 faces a substrate support assembly 220 disposed in the processing volume 215. As discussed below, the substrate support assembly 220 is configured to move a substrate support 222, and thus a substrate 230 disposed on the substrate support 222, between a raised substrate processing position (as shown) and a lowered substrate transfer position (not shown). When the substrate support assembly 220 is in the raised substrate processing position, the showerhead 218 and the substrate support 222 define a processing region 221.

The gas delivery system 204 is fluidly coupled to the processing chamber 202 through a gas inlet that is disposed through the lid plate 216. Processing or cleaning gases delivered, by use of the gas delivery system 204, flow through the gas inlet 223 into the gas distribution volume 219 and are distributed into the processing region 221 through the showerhead 218. In some embodiments, the chamber lid assembly 210 further includes a perforated blocker plate 225 disposed between the gas inlet 223 and the showerhead 218. In those embodiments, gases flowed into the gas distribution volume 219 are first diffused by the blocker plate 225 to, together with the showerhead 218, provide a more uniform or desired distribution of gas flow into the processing region 221.

The processing gases and processing by-products are evacuated radially outward from the processing region 221 through an annular channel 226 that surrounds the processing region 221. The annular channel 226 may be formed in a first annular liner 227 disposed radially inward of the one or more sidewalls 212 (as shown) or may be formed in the one or more sidewalls 212, which are used to protect the interior surfaces. In some embodiments, the processing chamber 202 includes one or more second liners 228 of the one or more sidewalls 212 or chamber base 214 from corrosive gases and/or undesired material deposition.

In some embodiments, a purge gas source 237 includes a first connection that is in fluid communication with the processing volume 215 so that it can be used to flow a chemically inert purge gas, such as argon (Ar), into a region disposed at a periphery of a substrate and/or beneath the substrate disposed on the substrate support 222, e.g., through the opening in the chamber base 214 surrounding the support shaft 262. The purge gas may be used to create a region of positive pressure below the substrate disposed on the substrate support 222 (when compared to the pressure in the processing region 221) during substrate processing. In some configurations, the purge gas is introduced through the chamber base 214 so that it flows upwardly therefrom and around the edges of the substrate support 222 to be evacuated from the processing volume 215 through the annular channel 226. In this configuration, the purge gas reduces undesirable material deposition on surfaces beneath the substrate support 222 by reducing and/or preventing the flow of material precursor gases thereinto.

The substrate support assembly 220 includes a movable support shaft 262 that sealingly extends through the chamber base 214, such as being surrounded by a bellows 265 in the region below the chamber base 214, and the substrate support 222, which is disposed on the movable support shaft 262. To facilitate substrate transfer to and from the substrate support 222, the substrate support assembly 220 includes a lift pin assembly 266 comprising a plurality of lift pins 267 coupled to or disposed in engagement with a lift pin hoop 268. The plurality of lift pins 267 are movably disposed in openings formed through the substrate support 222.

The substrate 230 is transferred to and from the substrate support 222 through a door 271, e.g., a slit valve disposed in one of the one or more sidewalls 212. Here, one or more openings in a region surrounding the door 271, e.g., openings in a door housing, are fluidly coupled to a purge gas source 237, e.g., an argon (Ar) gas source. The purge gas is used to prevent processing and cleaning gases from contacting and/or degrading a seal surrounding the door, thus extending the useful lifetime thereof.

The substrate support 222 is configured for vacuum chucking where the substrate 230 is secured to the substrate support 222 by applying a vacuum to an interface between the substrate 230 and the substrate receiving surface, such as with a vacuum source 272.

In some embodiments, the processing chamber 202 is configured for direct plasma processing. In those embodiments, the showerhead 218 may be electrically coupled to a first power supply 231, such as an RF power supply, which supplies power to form and maintain a capacitively coupled plasma using processing gases flowed into the processing region 221 through the showerhead 218. In some embodiments, the processing chamber 202 alternately comprises an inductively coupled plasma generator (not shown), and a plasma is formed through inductively coupling an RF power through an antenna disposed on the processing chamber 202 to the processing gas disposed in the processing volume 215.

The processing system 200 is advantageously configured to perform each of the tungsten nucleation, and bulk tungsten deposition processes without removing the substrate 230 from the processing chamber 202. The gases used to perform the individual processes, and to clean residues from the interior surfaces of the processing chamber, are delivered to the processing chamber 202 using the gas delivery system 204 fluidly coupled thereto.

Generally, the gas delivery system 204 includes one or more remote plasma sources, here radical generator 206, a deposition gas source 240, and the deposition gas source 240 to the lid assembly 210. The gas delivery system 204 further includes an isolation valve 290, disposed between the radical generator 206 and the lid plate 216, which may be used to fluidly isolate the radical generator 206 from the processing chamber 202 and from other radical generators, if applicable (not shown). Deposition gases, e.g., tungsten-containing precursors, molybdenum-containing precursors, and reducing agents, are delivered from the deposition gas source 240 to the processing chamber 202 using the conduit system 294.

The radical generator 206 is coupled to a power supply 293, such as a radio frequency (RF) power supply. The power supply 293 is used to ignite and maintain a plasma that is delivered to the plasma chamber volumes using gases provided from a corresponding gas source 287 fluidly coupled thereto.

Operation of the processing system 200 is facilitated by the system controller 208. The system controller 208 includes a programmable central processing unit, here the CPU 295, which is operable with a memory 296 (e.g., non-volatile memory) and support circuits 297. The CPU 295 is one of any form of general-purpose computer processor used in an industrial setting, such as a programmable logic controller (PLC), for controlling various chamber components and sub-processors. The memory 296, coupled to the CPU 295, facilitates the operation of the processing chamber. The support circuits 297 are conventionally coupled to the CPU 295 and comprise cache, clock circuits, input/output subsystems, power supplies, and the like, and combinations thereof coupled to the various components of the processing system 200 to facilitate control of substrate processing operations therewith.

The instructions in memory 296 are in the form of a program product, such as a program that implements the methods of the present disclosure. In one example, the disclosure may be implemented as a program product stored on computer-readable storage media for use with a computer system. The program(s) of the program product define functions of the embodiments (including the methods described herein). Thus, the computer-readable storage media, when carrying computer-readable instructions that direct the functions of the methods described herein, are embodiments of the present disclosure.

Figure 3A:
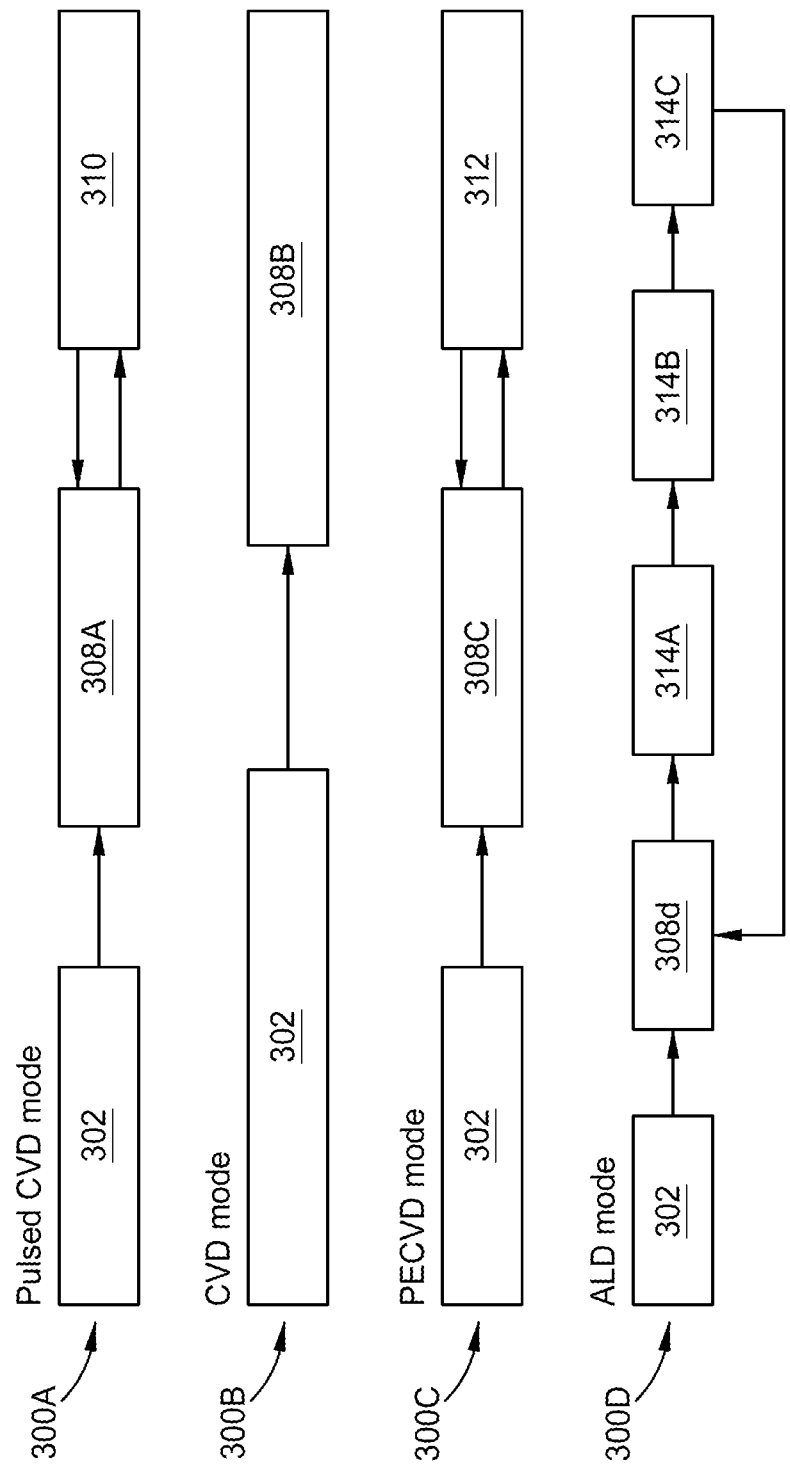
FIG. 3A illustrates four simplified process flows that can be separately used to form an interconnect structure on a substrate, according to some embodiments.

FIG. 3A is a diagram illustrating four simplified process flows used to process a substrate according to some embodiments, which may be performed, at least in part, using the processing system 200. In some implementations, the processing system 200 is capable of operating in one or more process modes to form at least a portion of an interconnect structure, such as a pulsed CVD mode 300A, a CVD mode 300B, a plasma enhanced CVD mode 300C, and an ALD mode 300D. Alternatively, other types of processing systems can also be used to perform one or more activities of one or more of the possible process modes.

The pulsed CVD mode 300A includes forming a nucleation layer, and forming a bulk layer over the nucleation by exposing the substrate to a gas mixture including a tungsten-containing precursor gas, a molybdenum-containing precursor gas, and a hydrogen-containing gas in activity 308A. The process volume can be continually purged using a purge gas in activity 310, which occurs between pulses of the gas mixture of activity 308A. During the pulsed CVD mode 300A process, unlike an atomic layer deposition (ALD) process, a gas, such as one or more precursor gases and/or purge gas, is continually delivered into and through the processing region of the process system.

The CVD mode 300B includes forming a nucleation layer, in activity 302, and then forming a bulk layer over the nucleation layer by coflowing a tungsten-containing precursor gas, a molybdenum-containing precursor gas, and a hydrogen-containing gas in activity 308B. During the CVD mode 300B process, the precursor gases are continually delivered into and through the processing region of the process system.

The plasma enhanced chemical vapor deposition (PECVD) mode 300C includes forming a nucleation layer, in activity 302, and then forming a bulk layer over the nucleation layer by exposing the substrate to a gas mixture including a tungsten-containing precursor gas, and a molybdenum-containing precursor gas, in activity 308C. In activity 312, a plasma is formed over the surface of the substrate by delivering RF power to a plasma processing gas (e.g., mixture of hydrogen ($H_2$) and argon (Ar)) that is flowing into and through the processing region of the processing system for a period of time. During the PECVD mode 300C process, a gas, such as one or more precursor gases or one or more plasma processing gases, is continually delivered into and through the processing region of the process system. Activities 308C and 312 are alternately cycled.

ALD mode 300D includes forming a nucleation layer, in activity 302, and then, in activity 308D, forming a bulk layer over the nucleation layer by exposing the substrate to a pulse of a gas mixture that includes a tungsten-containing precursor gas, and a molybdenum-containing precursor gas. In activity 314A, the substrate is exposed to a first purge gas pulse, in activity 314B, the substrate is exposed to a hydrogen-containing gas pulse, and in activity 314C, the substrate is exposed to a second purge gas pulse, which is the same or different from the first purge gas. Activities 308D, 314A, 314B, 314C are cyclically repeated to form the bulk layer.

Each of the process flows for each mode 300A-300D include the activity 302, which includes the formation of a nucleation layer over the substrate. The nucleation layer can be formed using any process capable of forming a tungsten nucleation layer.

Nucleation Layer Deposition

The nucleation layer can be formed using atomic layer deposition (ALD) of a tungsten-containing nucleation layer, or a physical vapor deposition (PVD) process. The physical vapor deposition process can include depositing a tungsten-containing layer, a tungsten molybdenum-containing layer, or a combination thereof, such as a tungsten-containing layer with a tungsten molybdenum-containing layer over the tungsten-containing layer. In some embodiments, after depositing the tungsten-containing nucleation layer, a nitrogen-containing gas is provided to the substrate, such as a nitrogen radical treatment, or an ammonia thermal soak. Without being bound by theory, it is believed that the nitrogen-containing gas suppress growth on a top portion of high aspect ratio features and enhances seam free growth. The nitrogen-containing gas treatment can be combined with any of the processes described herein prior to bulk layer deposition and after deposition of the nucleation layer.

Nucleation Layer Deposition Tungsten ALD

Figure 3B:
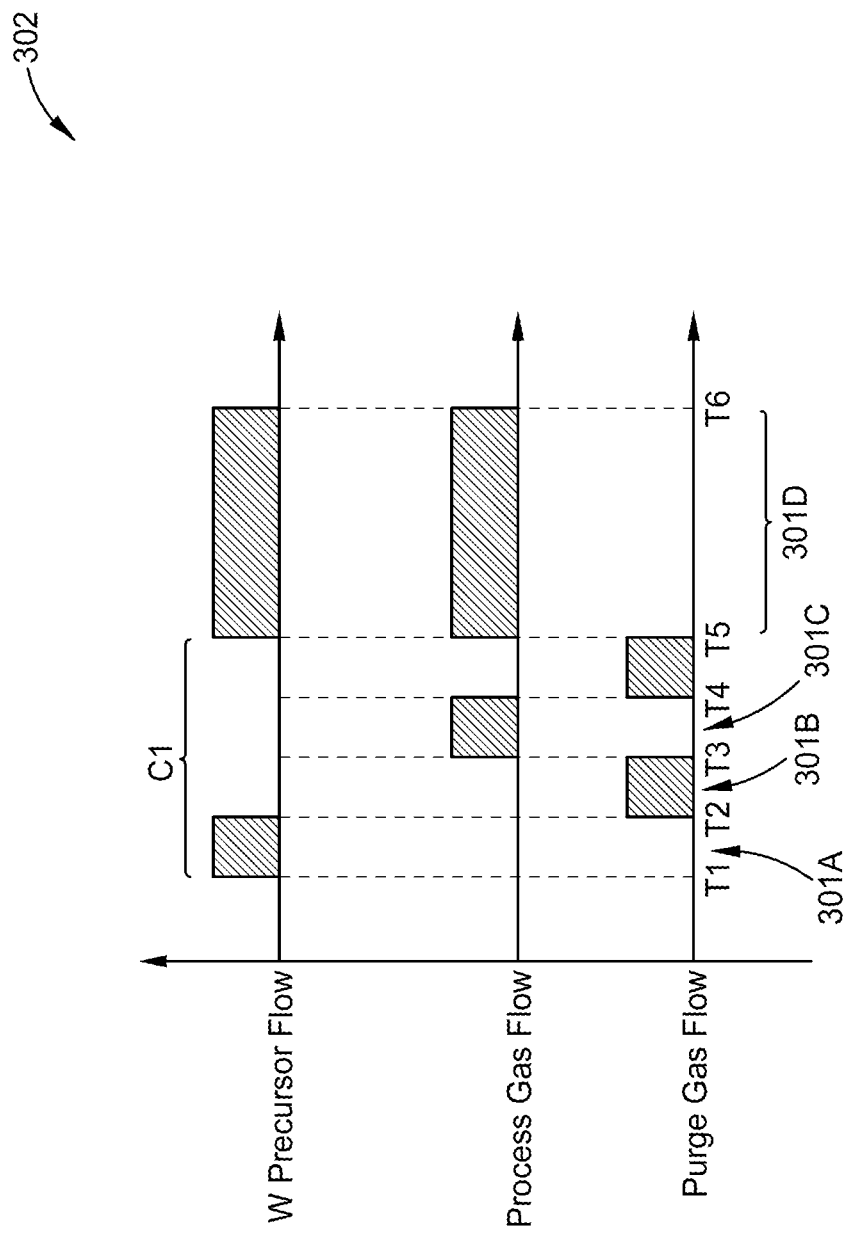
FIG. 3B illustrates a process flow timing diagram that can be used to form a nucleation layer on a substrate, according to some embodiments.

In some embodiments, a process of forming a nucleation layer can include one or more of the portions of the process sequence illustrated in FIG. 3B. In some embodiments, as shown in FIG. 3B, forming the nucleation layer includes, in activity 301A, exposing the substrate to a tungsten-containing precursor gas at a precursor gas flow rate. The tungsten-containing precursor is provided to the process volume at a flow rate of about 30 sccm to about 100 sccm, such as about 50 sccm to about 75 sccm, while the pressure within the process volume is maintained within a range of 3 Torr to 20 Torr. It should be noted that the flow rates for the various deposition and treatment processes described herein are for a processing system 200 configured to process a 300 mm diameter substrate. Appropriate scaling may be used for processing systems configured to process different-sized substrates. The temperature of the substrate during activity 301A can be maintained at a temperature between 300° C. and 450° C.

The tungsten-containing precursor is pulsed for a pulse time (e.g., T1 to T2) of about 0.5 seconds to about 5 seconds, such as about 1 second to about 3 seconds. Examples of suitable tungsten-containing precursors include tungsten halides, such as tungsten hexafluoride ($WF_6$), tungsten hexachloride ($WCl_6$), or combinations thereof. In some embodiments, the tungsten-containing precursor comprises an organometallic precursor and/or a fluorine-free precursor, e.g., MDNOW (methylcyclopentadienyl-dicarbonylnitrosyl-tungsten), EDNOW (ethylcyclopentadienyl-dicarbonylnitrosyl-tungsten), tungsten hexacarbonyl ($W(CO)_6$), or combinations thereof. In some embodiments, after each pulse 301A, a purge gas, such as a hydrogen-containing gas is supplied to the processing region 221, in activity 301B for a purge time (e.g., T2 to T3).

In activity 301C, the substrate is exposed to a reducing agent at a reducing agent flow rate. The reducing agent is provided to the process volume at a flow rate of about 50 sccm to about 600 sccm, such as about 100 sccm to about 500 sccm, such as about 200 sccm to about 400 sccm. In some embodiments, the reducing agent includes a boron-containing agent, such as diborane ($B_2H_6$). In some embodiments, the reducing agent includes a silane containing agent, such as $SiH_4$, $Si_2H_6$, or combinations thereof. In some embodiments, the tungsten-containing precursor includes $WF_6$, and the reducing agent includes a boron-containing agent, such as $B_2H_6$. The reducing agent is pulsed for a pulse time (e.g., T3 to T4) of about 0.5 seconds to about 5 seconds, such as about 1 second to about 3 seconds. In some embodiments, after each pulse 301C, a purge gas, such as a hydrogen-containing gas is supplied to the processing region 221, in activity 301B for a purge time (e.g., T4 to T5).

Activities 301A and 301C are alternated cyclically (e.g., cycle C1), beginning with either 301A or 301C, such as in an atomic layer deposition process. In some embodiments, activities 301A and 301C are cyclically alternated beginning with 301A and ending with 301C. The reducing agent gas flow rate to precursor agent flow rate ratio is about 1:2 or greater, such as about 1:2 to about 20:1, such as about 1:1 to about 15:1, such as about 5:1 to about 10:1, by volume. In some embodiments, the processing region 221 is purged between the alternating exposures, such as with a hydrogen-containing gas, such as $H_2$. In some embodiments, the process region 221 is continuously purged during activities 301A and 301C. Flowing the purge gas between the alternating exposures can each include a purge time (e.g., T2 to T3 and/or T4 to T5) of about 0.5 seconds to about 5 seconds.

During the nucleation layer formation, e.g., activity 302, the processing volume 215 is maintained at a pressure of about 3 Torr to about 20 Torr, such as about 5 Torr and about 15 Torr. The substrate can be heated to a temperature of about 300° C. to about 450° C., such as about 350° C. to about 400° C. Exposing the substrate to the tungsten-containing precursor includes flowing the tungsten-containing precursor into the processing region 221 from the deposition gas source 240. Exposing the substrate to the reducing agent includes flowing the reducing agent into the processing region 221 from the deposition gas source 240. The nucleation layer is deposited at a thickness of about 30 Å to about 200 Å, such as about 60 Å to about 120 Å. In some embodiments, the nucleation layer includes boron.

Nucleation Layer Deposition by Tungsten ALD and Tungsten CVD

In some embodiments, a nucleation layer is deposited by tungsten ALD by cycling activities 301A and 301C (optionally 301B between each activity) until a first portion of the nucleation layer is formed to a first thickness of about 30 Å to about 50 Å. A second portion of the nucleation layer is further deposited using a tungsten CVD process to a second thickness of about 50 Å to 200 Å. In some embodiments, a ratio of first thickness to second thickness is about 1:1 to about 1:3, such as about 1:1.2 to about 1:2. The tungsten CVD process includes flowing a tungsten-containing precursor, at activity 301D. The tungsten-containing precursor is flowed at a rate of about 50 sccm to about 1500 sccm, such as about 200 sccm, to about 1400 sccm, such as about 400 sccm to about 1200 sccm, such as about 600 sccm to about 1000 sccm. In some embodiments, a hydrogen-containing gas, such as $H_2$, is co-flowed with the tungsten-containing precursor. The hydrogen-containing gas is flowed at a flow rate of about 1,000 sccm to about 10,000 sccm, such as about 3,000 sccm to about 8,000 sccm, such as about 5,000 sccm to about 7,000 sccm. The process pressure of the processing volume 215 is about 3 Torr to about 30 Torr, such as about 10 Torr to about 20 Torr. The substrate is heated to about 300° C. to about 550° C., such as about 450° C. to about 500° C.

After forming the nucleation layer during activity 302, a bulk layer is formed over the nucleation layer. In some embodiments, the bulk layer includes tungsten and molybdenum, such as an alloy of tungsten and molybdenum. Depositing the bulk layer, can include depositing a tungsten gapfill material in at least an opening of the substrate. As briefly discussed above, the bulk layer can be formed using a pulsed chemical vapor deposition process 300A, a chemical vapor deposition process 300B, a plasma enhanced chemical vapor deposition process 300C, or an atomic layer deposition process 300D, each of which are described in further detail herein. It has been discovered that forming a nucleation layer by ALD only enables enhanced step coverage in some applications and using at least partially CVD enables enhanced throughput, while achieving desirable film properties, such as a low film stress, good gap fill characteristics and good film deposition uniformity.

Bulk Layer Deposition by Pulsed Chemical Vapor Deposition 300A

Figure 4A:
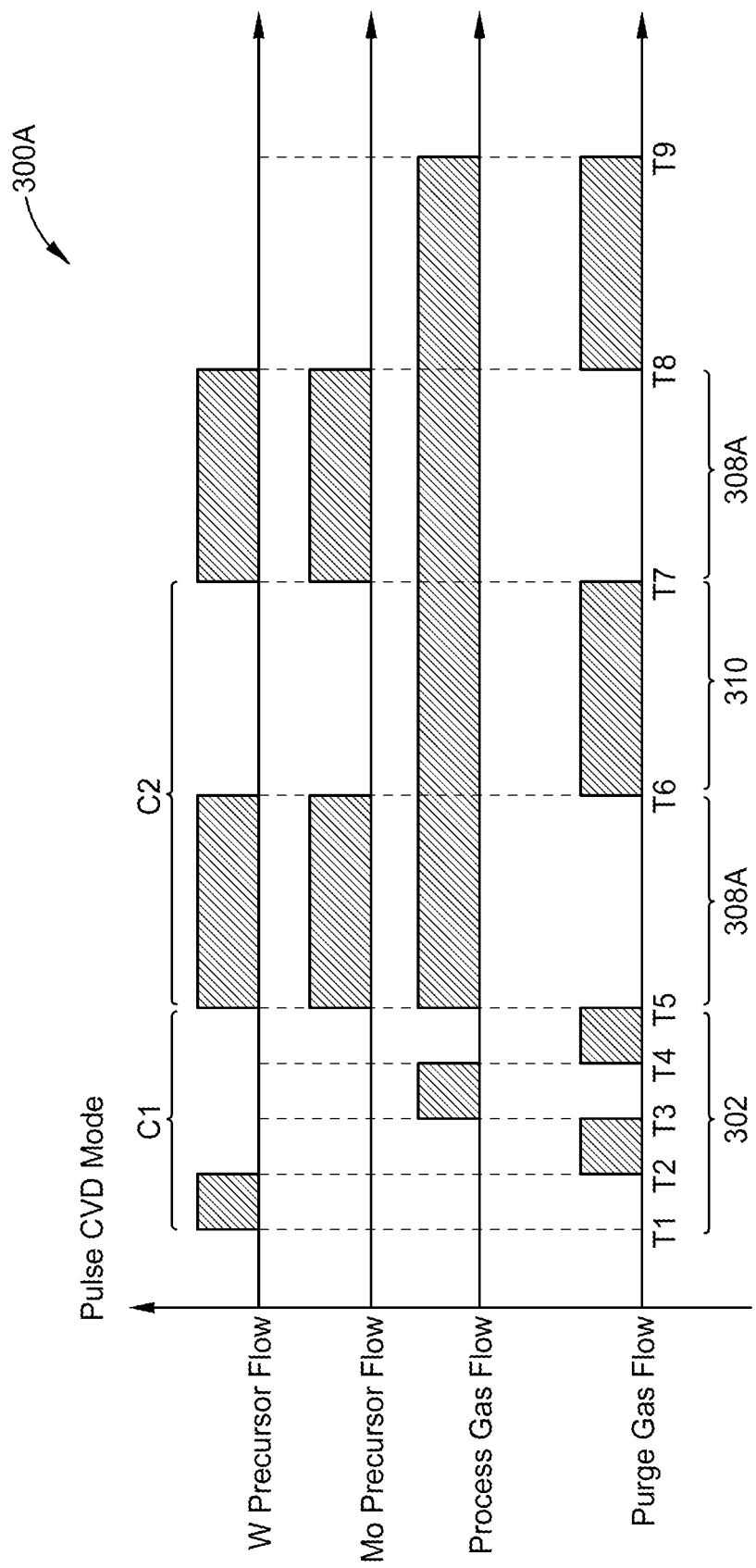
FIGS. 4A-4D are process flow timing diagrams that each illustrate a method of forming at least a portion of an interconnect structure on a substrate, according to one embodiment.

FIG. 4A depicts process parameter conditions for the bulk layer deposited using a "pulsed" chemical vapor deposition mode in which a flow of a gas is continually delivered during the process sequence. In activity 308A, a tungsten-containing precursor is flowed at a rate of about 100 sccm to about 1500 sccm, such as about 200 sccm, to about 1400 sccm, such as about 400 sccm to about 1200 sccm, such as about 600 sccm to about 1000 sccm. A molybdenum-containing precursor is flowed at a flow rate of about 5 sccm to about 300 sccm, such as about 10 sccm to about 30 sccm, or about 50 sccm to about 80 sccm.

In some embodiments, a ratio of tungsten precursor flow to molybdenum precursor flow is n:1 by volume, wherein n is about 1 to about 100, such as about 20:1 to about 200:1, such as about 50:1 to about 100:1. In some embodiments, the ratio of tungsten precursor flow to molybdenum precursor flow is greater than 1:1, or greater than 50:1, or greater than 100:1. The process pressure of the processing volume 215 is about 3 Torr to about 90 Torr, such as about 10 Torr to about 80 Torr, such as about 40 Torr to about 60 Torr. The substrate is heated to about 400° C. to about 550° C., such as about 450° C. to about 500° C.

The tungsten-containing precursor and the molybdenum-containing precursor are each co-flowed into the processing region 221 for a period of time (e.g., T5 to T6) of between about 1 second and about 10 seconds, such as between about 2 seconds and about 4 seconds. In some embodiments, a hydrogen-containing gas, such as $H_2$, is co-flowed with the tungsten-containing precursor and the molybdenum-containing precursor. The hydrogen-containing gas is flowed at a flow rate of about 3000 sccm to about 15000 sccm, such as about 5000 sccm to about 12000 sccm, such as about 7000 to about 10000 sccm.

In activity 310, a purge gas is flowed between exposures. Without being bound by theory, it is believed that purging between exposures of the tungsten-containing precursor and the molybdenum-containing precursor reduces etching that can be observed from the molybdenum-containing precursor within substrate openings. The purge gas can be an argon-containing gas, a hydrogen-containing gas, or a combination thereof. In some embodiments, the argon-containing gas is flowed at a rate of about 3,000 sccm to about 15,000 sccm. In some embodiments, the process gas (i.e., hydrogen-containing gas) is continuously flowed through activity 308A and 310. Activities 308A and 310 can be cyclically performed during the cycle C2 until the bulk layer is deposited to a bulk layer thickness. It has been discovered that a "pulsed" chemical vapor deposition using a purge gas enables deposition within substrates having high aspect ratio features by removing the molybdenum-containing precursor that can cause etching within the high aspect ratio features.

Bulk Layer Deposition by Chemical Vapor Deposition 300B

Figure 4B:
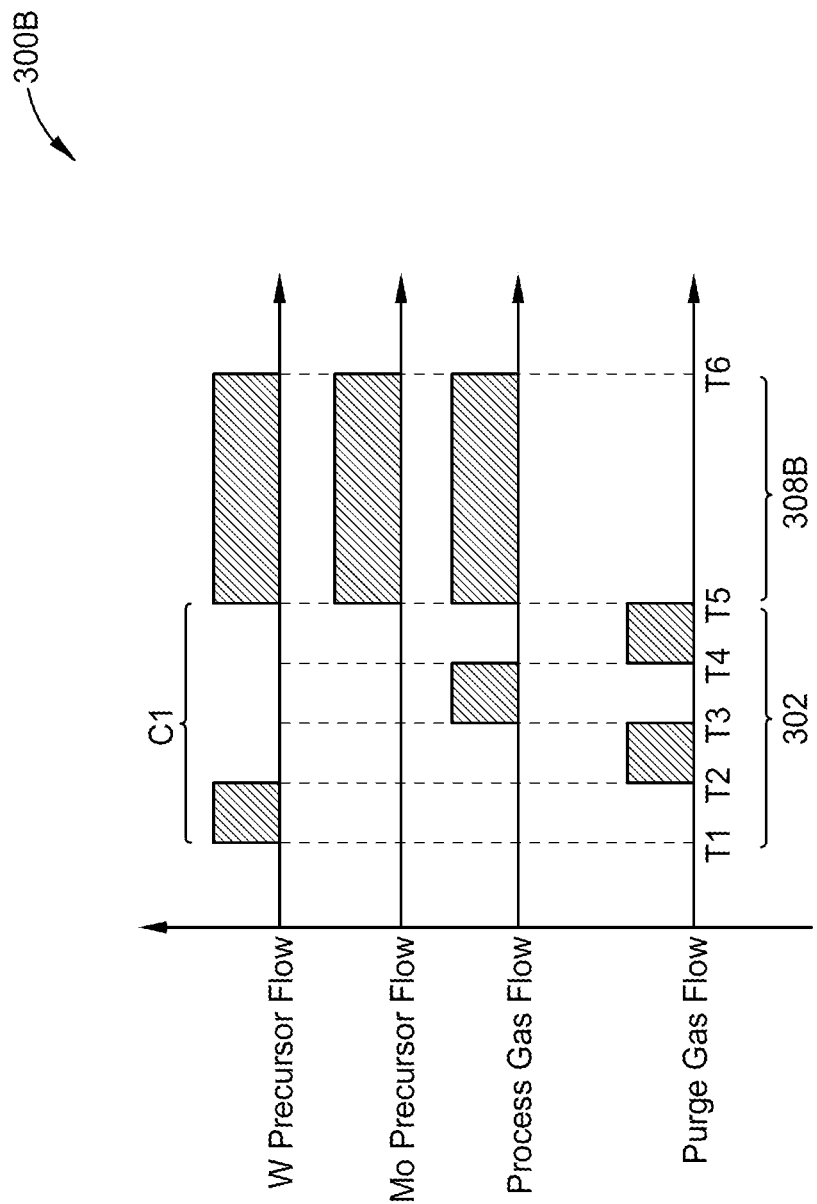

FIG. 4B depicts process parameter conditions for the bulk layer deposited using a chemical vapor deposition mode. In activity 308B, the bulk layer is continually deposited during the deposition period between times T5 and T6, and thus does not include a purge gas flow during activity 310 as shown in FIG. 4A. It has been discovered that the chemical vapor deposition process enables uniform deposition over planar surfaces or shallow structures having an aspect ratio of 1 to 5. The bulk layer is deposited uniformly without the need for purging.

In activity 308B, a tungsten-containing precursor is flowed at a rate of about 100 sccm to about 1500 sccm, such as about 200 sccm, to about 1400 sccm, such as about 400 sccm to about 1200 sccm, such as about 600 sccm to about 1000 sccm. A molybdenum-containing precursor is flowed at a flow rate of about 5 sccm to about 100 sccm, such as about 10 sccm to about 30 sccm, or about 50 sccm to about 80 sccm.

In some embodiments, a ratio of tungsten precursor flow to molybdenum precursor flow is n:1 by volume, wherein n is about 1 to about 100, such as about 10:1 to about 80:1, such as about 20:1 to about 60:1. In some embodiments, the ratio of tungsten precursor flow to molybdenum precursor flow is greater than 1:1, or greater than 50:1, or greater than 100:1. The process pressure of the processing volume 215 is about 3 Torr to about 90 Torr, such as about 10 Torr to about 80 Torr, such as about 40 Torr to about 60 Torr. The substrate is heated to about 400° C. to about 550° C., such as about 450° C. to about 500° C.

In some embodiments, a hydrogen-containing gas, such as $H_2$, is co-flowed with the tungsten-containing precursor and the molybdenum-containing precursor. The hydrogen-containing gas is flowed at a flow rate of about 3000 sccm to about 15000 sccm, such as about 5000 sccm to about 12000 sccm, such as about 7000 to about 10000 sccm.

It has been discovered for substrates having shallow, or low aspect ratio features, CVD process can provide a higher throughput while achieving a desired low film stress level, good gap fill characteristics and good film deposition uniformity.

Bulk Layer Deposition by Plasma Enhanced Chemical Vapor Deposition 300C

Figure 4C:
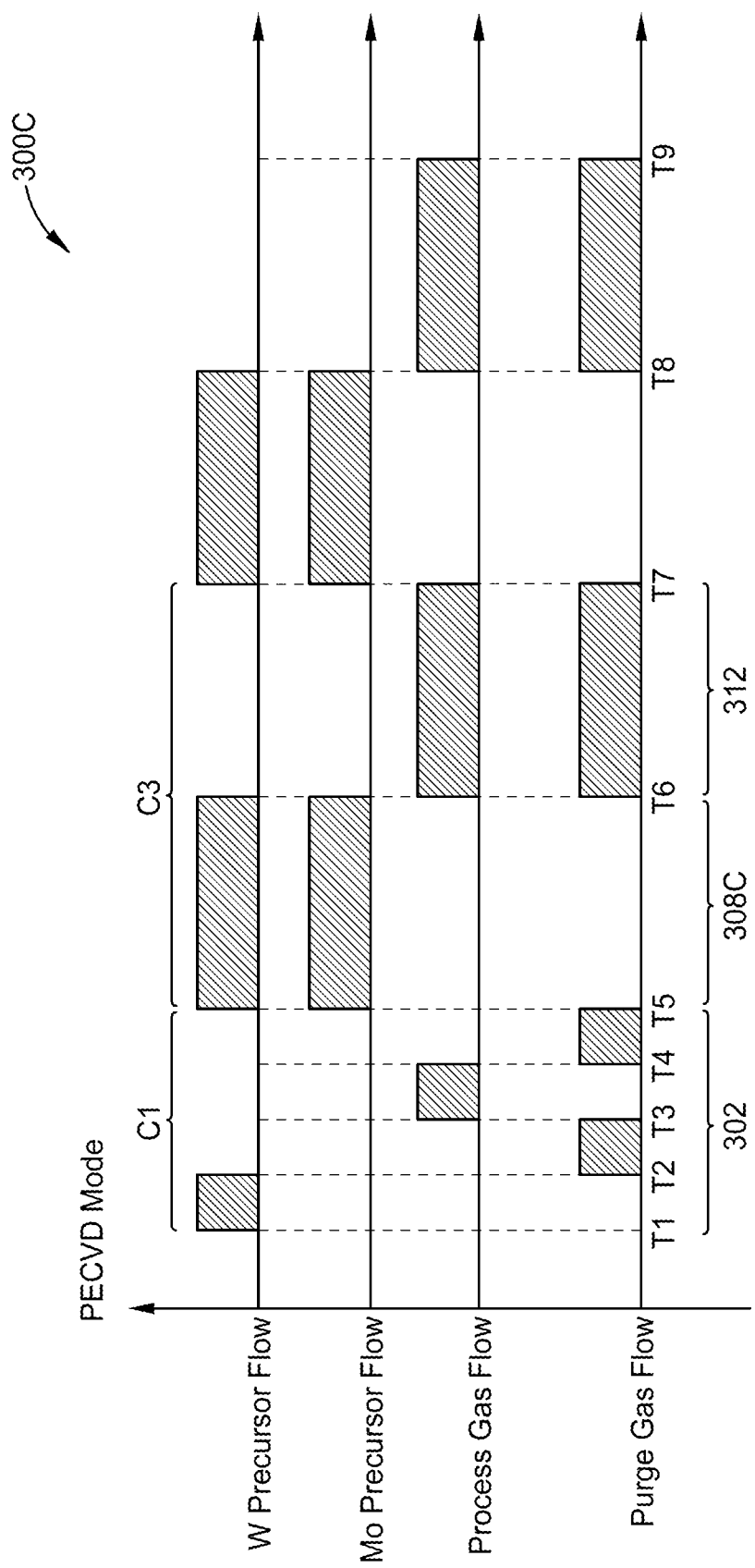

FIG. 4C depicts process parameter conditions for the bulk layer deposited using a plasma enhanced chemical vapor deposition (PECVD) mode. In some embodiments, the bulk layer is deposited by plasma enhanced chemical vapor deposition. In activity 308C, a tungsten-containing precursor and molybdenum-containing precursor are co-flowed using a pulse time (e.g., T7 to T8) of about 1 to about 4 seconds. The tungsten-containing precursor is flowed at a rate of about 100 sccm to about 1500 sccm, such as about 200 sccm, to about 1400 sccm, such as about 400 sccm to about 1200 sccm, such as about 600 sccm to about 1000 sccm. The molybdenum-containing precursor is flowed at a flow rate of about 5 sccm to about 100 sccm, such as about 10 sccm to about 30 sccm, or about 50 sccm to about 80 sccm.

Between pulses of activity 308C, the substrate is exposed to a plasma in activity 312. The plasma is formed by flowing one or more plasma processing gases, such as co-flowing a hydrogen-containing gas, such as $H_2$, and an argon-containing gas. The hydrogen-containing gas is flowed at a flow rate of about 500 sccm to about 3000 sccm, such as about 1000 sccm to about 2000 sccm. The argon-containing gas is flowed at a flow rate of about 500 sccm to about 3000 sccm. An amount of RF power is applied by a power source to the argon-containing gas and the hydrogen-containing gas, such as a gas disposed in a processing region of a remote plasma source or to an antenna or electrode disposed on or within the processing system. In some embodiments, a power of about 50 W to about 600 W is applied at an RF frequency (e.g., 13.56 MHz) to the processing region of the remote plasma source or processing region of the processing system. In some embodiments, the plasma is injected in the processing volume between exposures of the deposition gases describes with respect to the chemical vapor deposition process. The plasma exposure time (e.g., T8 to T9) is about 0.5 seconds to about 5 seconds, such as about 1 second to about 3 seconds. The plasma pressure condition is about 3 Torr to about 30 Torr within the processing region of the processing system. Activities 308C and 312 are cyclically performed during the cycle C3 until the bulk layer is deposited to a predetermined thickness. The substrate is heated to about 400° C. to about 550° C., such as about 450° C. to about 500° C.

Bulk Layer Deposition by Atomic Layer Deposition 300D

Figure 4D:
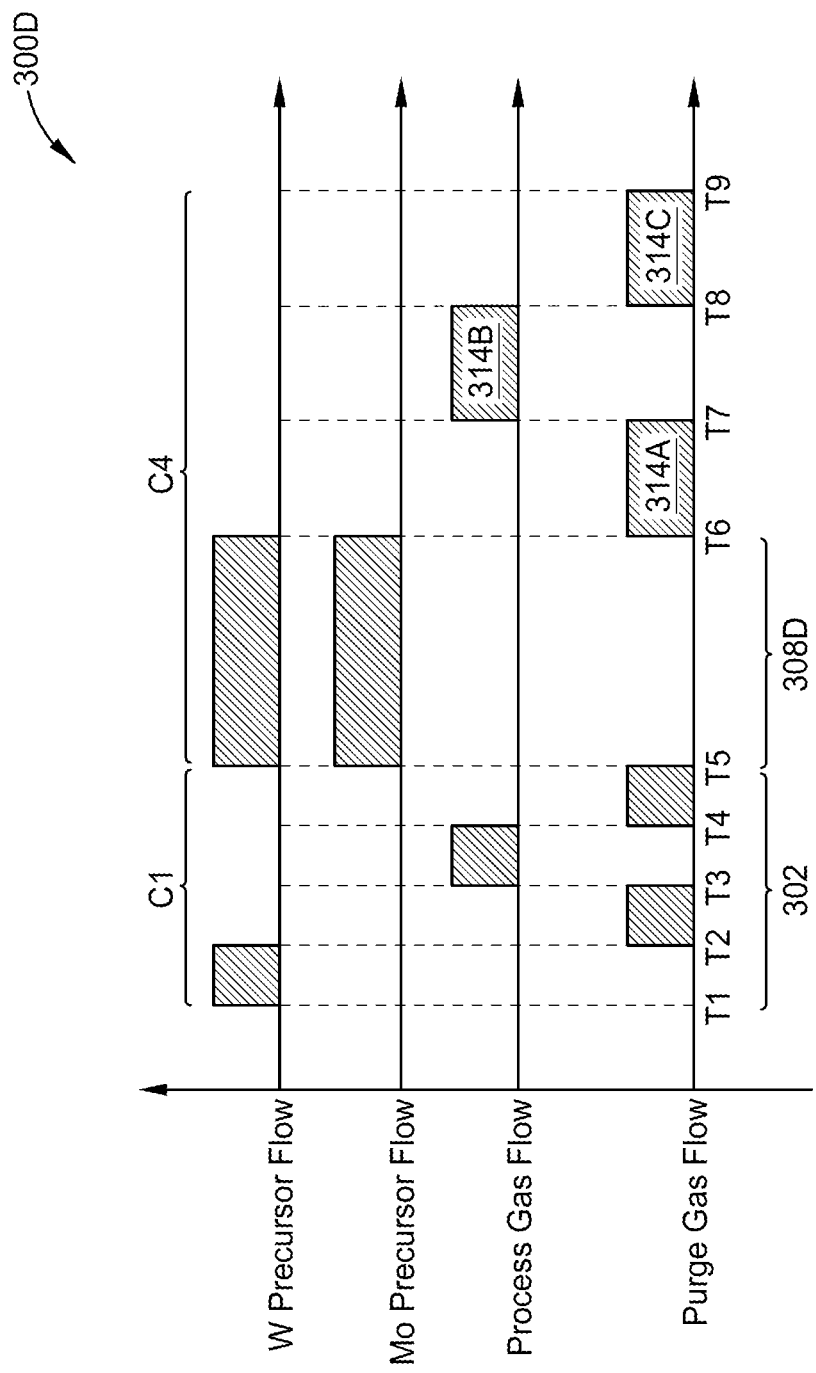

FIG. 4D depicts process parameter conditions for the bulk layer deposited using an atomic layer deposition mode. In activity 308D, tungsten-containing precursor is flowed at a rate of about 100 sccm to about 1500 sccm, such as about 200 sccm, to about 1400 sccm, such as about 400 sccm to about 1200 sccm, such as about 600 sccm to about 1000 sccm. The molybdenum-containing precursor is flowed at a flow rate of about 5 sccm to about 100 sccm, such as about 10 sccm to about 30 sccm, or about 50 sccm to about 80 sccm.

In some embodiments, a ratio of tungsten precursor flow to molybdenum precursor flow is n:1 by volume, wherein n is about 1 to about 100, such as about 10:1 to about 80:1, such as about 20:1 to about 60:1. In some embodiments, the ratio of tungsten precursor flow to molybdenum precursor flow is greater than 1:1, or greater than 50:1, or greater than 100:1. The process pressure of the processing volume 215 is about 3 Torr to about 90 Torr, such as about 10 Torr to about 80 Torr, such as about 40 Torr to about 60 Torr. The substrate is heated to about 400° C. to about 550° C., such as about 450° C. to about 500° C.

A pulsed amount of the tungsten-containing precursor and the molybdenum-containing precursor are each co-flowed and then held within the processing region 221 for a duration (e.g., T5 to T6) of between about 1 second and about 10 seconds, such as between about 2 seconds and about 4 seconds. In activity 314A, a pulsed amount of a first purge gas is flowed between exposures of the molybdenum and tungsten precursors. The first purge gas includes an argon containing gas. In some embodiments, a pulsed amount of argon gas is supplied at a purge time (e.g., T6 to T7) of about 1 second to about 5 seconds. The first purge gas may be delivered from the deposition gas source 240 or from the bypass gas source. In activity 314B, a pulsed amount of a hydrogen-containing gas, such as $H_2$, is flowed after each exposure of the purge gas. The hydrogen-containing gas is flowed at a flow rate of about 3000 sccm to about 15000 sccm, such as about 5000 sccm to about 12000 sccm, such as about 7000 to about 10000 sccm. The hydrogen-containing gas is flowed at a purge time (e.g., T7 to T8) of about 1 second to 5 seconds. In activity 314C, a pulsed amount of a second purge gas is flowed after the hydrogen-containing gas, such as argon gas. The second purge gas condition can be substantially the same as the first purge gas condition. In some embodiment, the second purge gas time (e.g., T8 to T9) is about 1 second to about 5 seconds. Activities 308D, 314A, 314B, and 314B are cyclically performed in during a cycle C4 until the bulk layer is deposited to a predetermined thickness.

EXAMPLES

Four samples were produced using different process conditions, including process conditions described in some embodiments of the present disclosure. Each of the samples were characterized and compared relative to one another. The conditions and properties of the samples are summarized in Table 1 depicted below.

TABLE 1

Tungsten Bulk Layer and Tungsten-Molybdenum Alloy Comparison

| Sample No. | Condition | W XRF (Å) | Mo XRF (Å) | Stress (MPa) | Resistivity |
|---|---|---|---|---|---|
| 1 | WF$_6$ only | 1624 | 16.93 | 857 | 11.1 |
| 2 | WF$_6$ and MoF$_6$ co-flow | 1711 | 217 | 380 | 11.1 |

Each of the samples were formed by first depositing a nucleation layer over the substrate at a substrate temperature of 450° C. The nucleation layer was deposited by alternating exposures of WF$_6$ (at a flow rate of about 60 sccm) and B$_2$H$_6$ (at a flow rate of about 400 sccm). Each exposure had a pulse time of about 1.5 seconds. Between each exposure of WF$_6$ and B$_2$H$_6$, H$_2$ purge gas was flowed for about 1.5 seconds.

In samples 1 and 2, a bulk tungsten-containing layer was deposited over the nucleation layer. For sample 1, only WF$_6$ was flowed to deposit the bulk tungsten-containing layer using a continuous CVD process in accordance with conventional processes. For sample 2, WF$_6$ and MoF$_6$ were co-flowed using pulsed CVD mode using a method described herein. The gases were co-flowed for 1 second per exposure. Between each exposure, the substrate was purged with hydrogen at a flow rate of 12000 sccm for 5 seconds.

The processed substrates, e.g., samples 1 and 2 were each evaluated using an X-ray florescence (XRF) wafer inspection system to determine amount of tungsten and molybdenum within the film. In some embodiments, thickness is calibrated by scanning electron microscopy or transmission electron microscopy. In some embodiments, composition is calibrated by x-ray photoelectron spectroscopy (XPS). The thickness of tungsten and molybdenum is determined based on a reading of peaks associated with each of these elements. Each sample was also evaluated under scanning electron microscopy to determine total thickness of the layers deposited over the substrate. The film stress for each sample was determined by measuring the bow or curvature of the sample by use of ellipsometry techniques. As can be seen in Table 1, both sample 2 formed using a method of the present disclosure showed a reduced stress while maintaining the same resistivity of about 11.1 μΩ·cm.

Embodiments herein are generally directed electronic device manufacturing and, more particularly, to systems and methods for forming a structure having tungsten and molybdenum in a semiconductor device manufacturing scheme. Forming tungsten, molybdenum alloy structures reduces the overall stress of the structure, without substantially affecting throughput, resistivity, or surface roughness relative to conventional tungsten structures that do not include molybdenum.

While the foregoing is directed to embodiments of the present disclosure, other and further embodiments of the disclosure may be devised without departing from the basic scope thereof, and the scope thereof is determined by the claims that follow.

What is claimed is:

1. A method of forming an interconnect structure over a substrate, comprising:
    forming a nucleation layer comprising tungsten over the substrate, comprising cycles, each cycle comprising:
        pulsing a tungsten-containing precursor gas at a precursor gas flow rate for a first period of time;
        pulsing a purge gas for a second period of time;
        pulsing a reducing agent at a reducing agent flow rate for a third period of time;
        pulsing the purge gas for a fourth period of time; and
    forming a bulk layer comprising an alloy of tungsten and molybdenum over the nucleation layer using a pulsed chemical vapor deposition, comprising cycles, each cycle comprising:
        pulsing the tungsten-containing precursor gas and a molybdenum-containing precursor gas simultaneously for a fifth period of time;
        subsequent to the pulsing of the tungsten-containing precursor gas and the molybdenum-containing precursor gas, pulsing the purge gas for a sixth period of time; and
        continuously flowing the reducing agent for the fifth period of time and the sixth period of time.

2. The method of claim 1, wherein the tungsten-containing precursor gas is selected from the group consisting of tungsten hexafluoride (WF$_6$), tungsten hexachloride (WCl$_6$), and a combination thereof.

3. The method of claim 1, wherein the reducing agent is selected from the group consisting of a boron-containing gas, a silane, and a combination thereof.

4. The method of claim 1, wherein forming the nucleation layer comprises a pressure about 3 Torr to about 20 Torr.

5. The method of claim 1, forming the bulk layer comprises heating the substrate to about 400° C. to about 550° C.

6. The method of claim 1, wherein the pulsing of the tungsten-containing precursor gas is performed during physical vapor deposition.

7. The method of claim 6, wherein the pulsing of the molybdenum-containing precursor gas is performed during physical vapor deposition.

8. The method of claim 1, wherein:
    the first period of time is between 1 and 4 seconds; and
    the second period is between 1 second and 4 seconds.

* * * * *